United States Patent [19]

Yokoyama

[11] 4,280,102

[45] Jul. 21, 1981

[54] FREQUENCY RESPONSE CHARACTERISTIC ADJUSTABLE CIRCUIT

[75] Inventor: Kenji Yokoyama, Hamamatsu, Japan

[73] Assignee: Nippon Gakki Seizo Kabushiki Kaisha, Hamamatsu, Japan

[21] Appl. No.: 96,914

[22] Filed: Nov. 23, 1979

[30] Foreign Application Priority Data

Dec. 4, 1978 [JP] Japan .................................. 53-149796

[51] Int. Cl.³ .............................................. H03F 1/34
[52] U.S. Cl. ...................................... 330/85; 330/109
[58] Field of Search ................ 330/85, 107, 109, 294; 333/28 T; 179/1 D, 100.1 TC

[56] References Cited

U.S. PATENT DOCUMENTS 4,151,477 4/1979 Yokoyama .......................... 330/107

Primary Examiner—James B. Mullins
Attorney, Agent, or Firm—Frishauf, Holtz, Goodman & Woodward

[57] ABSTRACT

A frequency response characteristic adjustable circuit which is comprised of first and second operational amplifiers, a potentiometer, a filter circuit having a lowpass, highpass or bandpass characteristic and resistors and suited for a tone control circuit in an audio amplifier system. The frequency range, over which the circuit gain is to be controlled, is determined by the frequency characteristic of the filter circuit, and the circuit gain is controlled by adjusting the potentiometer without affecting the frequency range.

13 Claims, 16 Drawing Figures

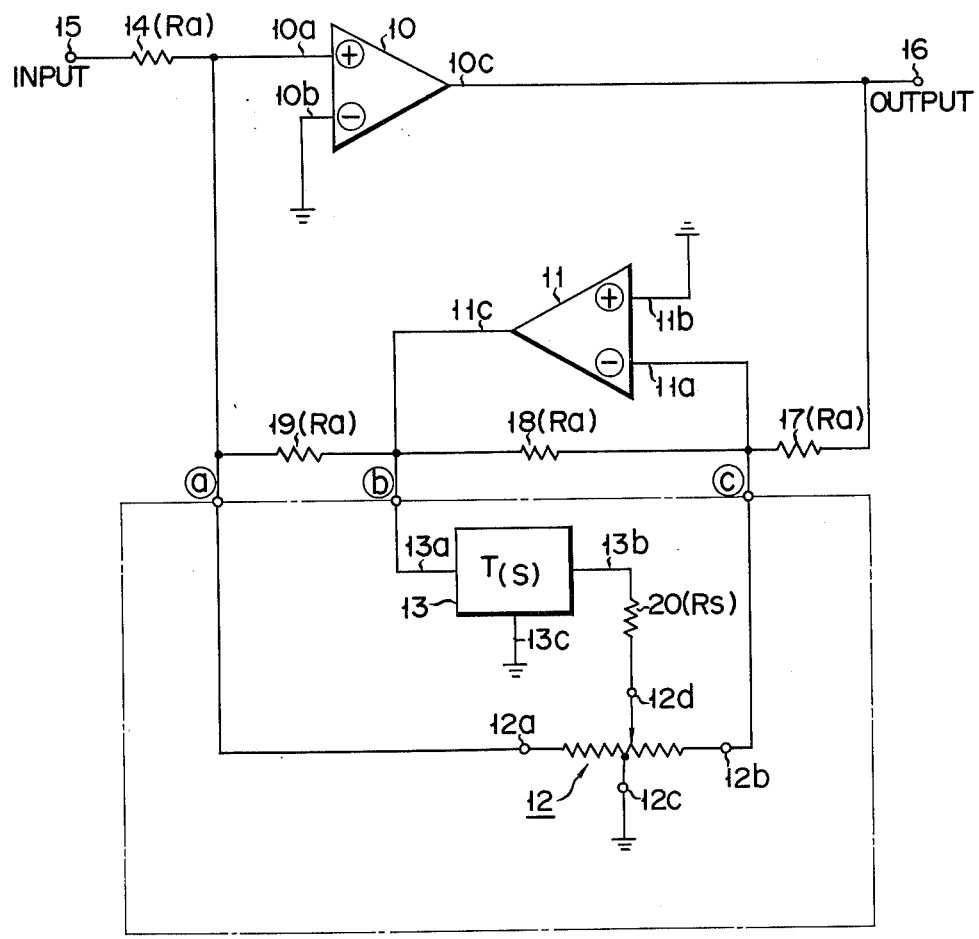
F I G. 3

FREQUENCY RESPONSE CHARACTERISTIC ADJUSTABLE CIRCUIT

BACKGROUND OF THE INVENTION

This invention relates to a frequency response characteristic adjustable circuit particularly suited for a tone control circuit.

Tone control circuits used in audio amplifier systems usually have bass boost/cut and treble boost/cut frequency response characteristics. In order to obtain such frequency characteristics, various tone control circuits have been proposed, and they generally include such an RC circuit as shown in FIG. 1. The RC circuit of FIG. 1 is a basic bass-boost or treble-cut circuit comprised of resistors 1 and 3 and a capacitor 2 which has such a frequency response as shown in FIG. 2. The roll-off frequency fC1 and turn-over frequency fC2 of this circuit are respectively given by $$fC1 = \frac{1}{2\pi C1(R1 + R2)} \quad (1)$$

$$fC2 = \frac{1}{2\pi C1 \cdot \frac{R1 \cdot R2}{R1 + R2}} \quad (2)$$

where C1 is a capacitance value of the capacitor 2, and R1 and R2 are resistance values of the resistors 1 and 3 respectively. The adjustment of the attenuation level or circuit gain H over a frequency range above the frequency fC2 is usually made by adjusting either one of the resistors 1 and 3. However, this adjustment also changes the frequencies fC1 and fC2, that is, the frequency characteristic, as is seen from equations (1) and (2). In other words, the control circuit using the RC circuit shown in FIG. 1 has a drawback that adjustment of the attenuation level over a particular frequency range results in a change of the frequency range itself.

An object of the invention is to provide a frequency response characteristic adjustable circuit, which permits adjustment of the circuit gain over a particular frequency range without varying the frequency range itself.

SUMMARY OF THE INVENTION

According to the invention, a frequency response characteristic adjustable circuit comprises a first operational amplifier having a first input terminal connected through a first resistor to an input terminal for receiving an input signal, a second input terminal connected to circuit ground and an output terminal connected to an output terminal for providing an output signal, a second operational amplifier having a first input terminal connected to circuit ground, a second input terminal connected through a second resistor to the output terminal of the first operational amplifier and an output terminal connected through a third resistor to the second input terminal of the second operational amplifier and also through a fourth resistor to the first input terminal of the first operational amplifier, a potentiometer having a first fixed terminal connected to the first input terminal of the first operational amplifier, a second fixed terminal connected to the second input terminal of the second operational amplifier, a center tap connected to circuit ground and a slider terminal, and a filter circuit having a first terminal connected to the output terminal of the second operational amplifier, a second terminal connected to the slider terminal of the potentiometer and a third terminal connected to circuit ground.

The filter circuit may be a lowpass filter, a highpass filter or a bandpass filter.

BRIEF DESCRIPTION OF THE DRAWING

FIG. 3 is a schematic circuit diagram a frequency response adjustable circuit embodying the invention;

DETAILED DESCRIPTION

Figure 1:
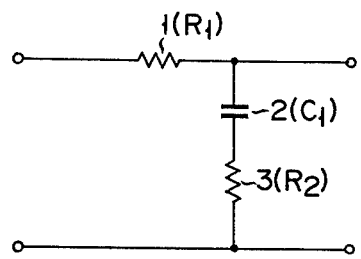
FIG. 1 is a circuit diagram of a basic filter circuit used in a prior-art tone control circuit.
Figure 2:
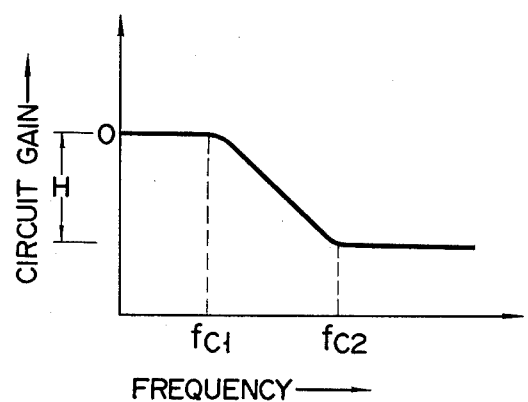
FIG. 2 shows the frequency response characteristic of the filter circuit of FIG. 1.

Referring now to FIG. 3, which shows a frequency response characteristic adjustable circuit embodying the invention, reference numeral 10 designates a first operational amplifier, 11 a second operational amplifier, 12 a potentiometer and 13 a filter circuit. The first operational amplifier 10 functions as a noninverting amplifier, and accordingly it has its noninverting input terminal 10a connected through a resistor 14 having resistance value Ra to an input terminal 15 for receiving an input signal and its inverting input terminal 10b connected to circuit ground. The output terminal 10c of the amplifier 10 is connected to an output terminal 16 of the frequency response characteristic adjustable circuit. The second operational amplifier 11, which functions as an inverting amplifier, has its inverting input terminal 11a connected through a resistor 17 of resistance value Ra to the output terminal 16 and its noninverting input terminal connected to circuit ground. The output terminal 11c of operational amplifier 11 is connected through a resistor 18 of resistance value Ra to its inverting input terminal 11a and also connected through a resistor 19 of resistance value Ra to the noninverting input terminal 10a of the first operational amplifier 10. The potentiometer 12 has a fixed terminal 12a connected to the noninverting terminal 10a of the first operational amplifier 10, the other fixed terminal 12b being connected to the inverting input terminal 11a of the second operational amplifier 11 and a center tap 12c being connected to circuit ground. The resistance value of the potentiometer 12 between the fixed terminals 12a and 12b thereof is Rv. The filter circuit 13 is a three-terminal circuit having a terminal 13a connected to the output terminal 11c of the second operational amplifier 11, a terminal 13b connected through a resistor 20 of a resistance value Rs to the slider 12d of potentiometer 12 and a terminal 13c connected to circuit ground.

Figure 4:
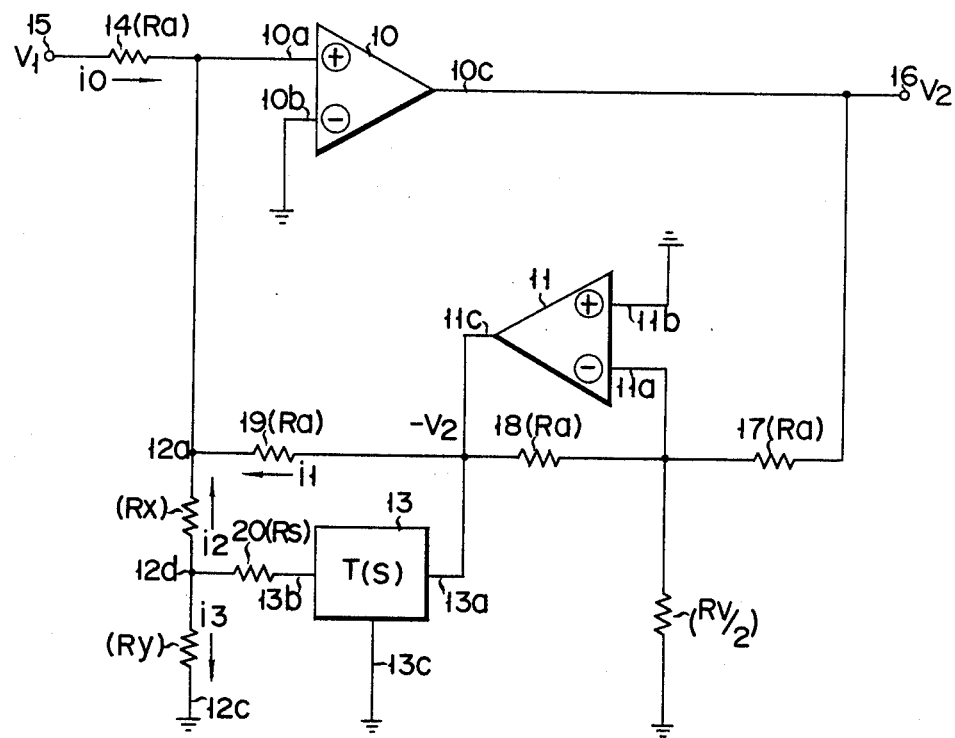
FIGS. 4 and 5 are diagrams useful for the explanation of the circuit of FIG. 3.

When the slider 12d of potentiometer 12 is positioned between the fixed terminal 12a and center tap 12c, the circuit of FIG. 3 can be rewritten as shown in FIG. 4. In FIG. 4, Rx indicates the resistance value between the fixed terminal 12a and slider 12d, and Ry is the resistance value between the slider 12d and center tap 12c. Assuming an input voltage applied to the input terminal 15 to be $V_1$ and an output voltage obtained at the output terminal 16 to be $V_2$, the output voltage of the second operational amplifier 11 is $-V_2$ since the resistors 17 and 18 have equal resistance value (Ra). Since the noninverting input terminal 10a of first operational amplifier 10 is a virtual ground point, the following equations hold:

$$V1 = Ra \cdot i0 \quad (3)$$

$$-V2 = Ra \cdot i1 \quad (4)$$

$$-T(s) \cdot V2 = Rs(i2 + i3) + Rx \cdot i2 \quad (5)$$

$$i2 \cdot Rx = i3 \cdot Ry \quad (6)$$

$$-i0 = i1 + i2 \quad (7)$$

where T(s) is a transfer function of the filter circuit 13. i0 is a current flowing through the resistor 14. i2 is a current flowing from the slider 12d of potentiometer 12 to the fixed terminal 12a thereof, and i3 is a current flowing from the slider 12d to the center tap 12c of potentiometer 12.

Substituting equation (6) into equation (5) yields $$-T(s) \cdot V2 = Rs\left(i2 + \frac{Rx}{Ry} \cdot i2\right) + Rx \cdot i2 \quad (8)$$

$$= (k \cdot Rs + Rx)i2$$

where $k = 1 + (Rx/Ry)$.

Substituting equations (4), (7) and (8) into equation (3) yields $$V1 = Ra \cdot i0 = Ra(-i1 - i2) = Ra\left(\frac{V2}{Ra} + \frac{V2 \cdot T(s)}{Rx + k \cdot Rs}\right)$$

$$= V2\left(1 + \frac{Ra \cdot T(s)}{Rx + k \cdot Rs}\right)$$

Thus, the transfer function Tx of the circuit between the input and output terminals 15 and 16 is $$Tx = \frac{V2}{V1} = \frac{1}{1 - \frac{Ra}{Rx - k \cdot Rs} \cdot T(s)} \quad (9)$$

Equation (9) shows that the circuit gain of the circuit of FIG. 4 can be varied by varying the factor k without affecting the transfer function T(s) of the filter circuit.

Figure 5:
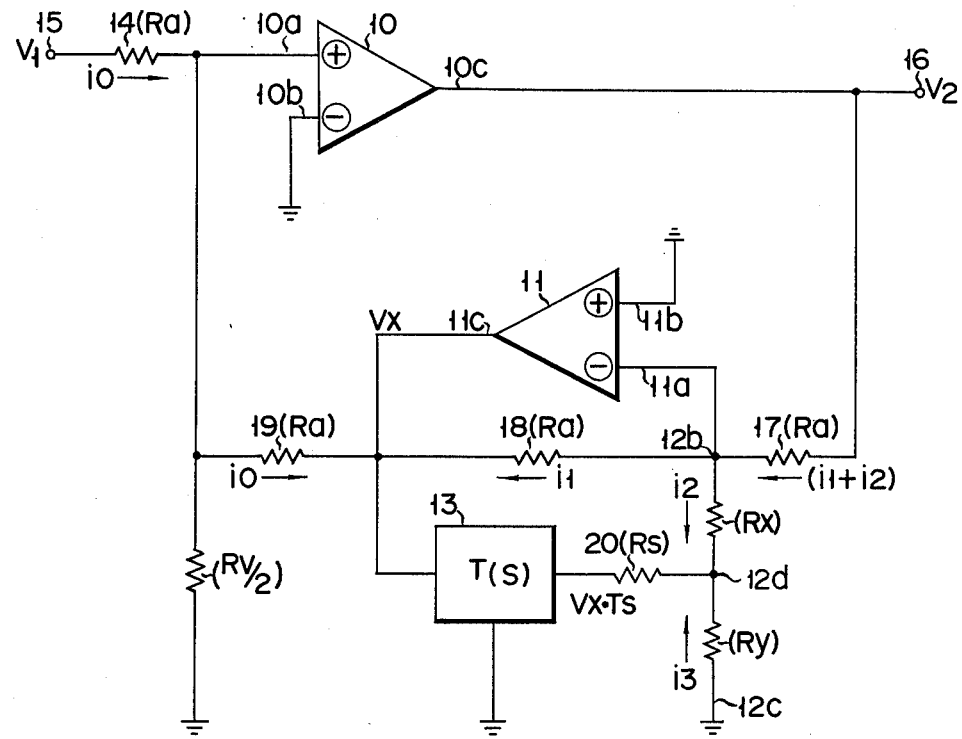

Next, when the slider 12d of potentiometer 12 is positioned between the fixed terminal 12b and center tap 12c, the circuit of FIG. 3 can be rewritten as shown in FIG. 5.

In this case, we have $$V1 = Ra \cdot i0 \quad (10)$$

$$V2 = Ra(i1 - i2) \quad (11)$$

$$Vx = -Ra \cdot i0 \quad (12)$$

$$Vx = -Ra \cdot i1 \quad (13)$$

$$Vx \cdot T(s) = -Rx \cdot i2 - Rs(i2 - i3) \quad (14)$$

$$i2 \cdot Rx = i3 \cdot Ry \quad (15)$$

where V1 is an input voltage applied to the input terminal 15, V2 is an output voltage at the output terminal 16, Vx is an output voltage of the second operational amplifier, i1 is a current flowing through the resistors 14 and 19, i2 is a current flowing from the fixed terminal 12b to the slider 12 of potentiometer 12, and i3 is a current flowing from the center tap 12c to the slider 12d of potentiometer 12.

Since i0 = i1 from equations (12) and (13).

$$i1 = V1/Ra \quad (16)$$

Substituting equation (15) into equation (14) yields $$Vx \cdot T(s) = -Rx \cdot i2 - k \cdot Rs \cdot i2 = -i2(Rx - k \cdot Rs)$$

where $k = 1 + (Rx/Ry)$.

Since Vx = −V1 from equations (10) and (12).

$$i2 = \frac{V1 \cdot T(s)}{Rx - k \cdot Rs} \quad (17)$$

substituting equations (16) and (17) into equation (11) yields $$V2 = Ra\left(\frac{V1}{Ra} - \frac{V1 \cdot T(s)}{Rx - k \cdot Rs}\right) =$$

$$V1\left(1 - \frac{Ra \cdot T(s)}{Rx - k \cdot Rs}\right)$$

Thus, the transfer function Ty of the circuit of FIG. 5 is $$Ty = 1 - \frac{Ra \cdot T(s)}{Rx - k \cdot Rs} \quad (18)$$

The product of Tx and Ty is Tx·Ty = 1. This means that the gain of the circuit of FIG. 3 is varied symmetrically when the slider 12d of potentiometer 12 is shifted from the center tap 12c toward the fixed terminal 12a and when it is shifted toward the fixed terminal 12b with respect to the circuit gain obtained when the slider is positioned at the center tap 12c. The frequency range, over which the circuit gain is to be adjusted, is determined by the frequency response of the filter circuit 13, and also the filter circuit response is not affected by the adjustment of potentiometer 12.

Figure 6:
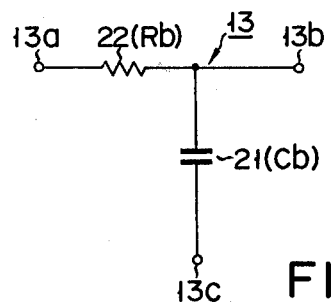
FIG. 6 is a circuit diagram of a lowpass filter circuit which may be used as the filter circuit in the circuit of FIG. 3.

FIG. 6 shows a lowpass filter, as an example of the filter circuit 13, comprising a resistor 22 of a resistance value Rb and a capacitor 21 of a capacitance value Cb. The transfer function T(s) of the lowpass filter is $$T(s) = \frac{1}{1 + s \cdot Rb \cdot Cb} \quad (19)$$

where $s = j\omega$

Figure 7:
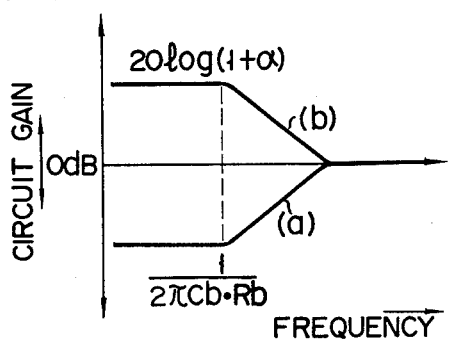
FIG. 7 shows bass boost/cut characteristics of the circuit of FIG. 3 when the filter circuit of FIG. 6 is used.

Thus, the transfer function Tx of the circuit of FIG. 4 is represented by $$Tx = \frac{1}{1 + \frac{Ra}{Rx + k \cdot Rs} \times \frac{1}{1 + s \cdot Rb \cdot Cb}} \quad (20)$$

$$= \frac{1}{1 + \frac{a}{1 + s \cdot Rb \cdot Cb}}$$

where $a = \frac{Ra}{Rx + k \cdot Rx} \left( 0 \leq a \leq \frac{Ra}{Rs} \right)$ Curve (a) in FIG. 7 typically shows the frequency response of the circuit of FIG. 3 when the slider 12d of potentiometer 12 is placed between the fixed terminal 12a and center tap 12c.

The transfer function Ty of the circuit of FIG. 5, on the other hand, is $$Ty = 1 + \frac{Ra}{Rx + k \cdot Rs} \cdot \frac{1}{1 + s \cdot Cb \cdot Rb} \quad (21)$$

$$= 1 + \frac{a}{1 + s \cdot Cb \cdot Rb}$$

Curve (b) in FIG. 7 typically shows the frequency response of the circuit of FIG. 3, when the slider 12d of potentiometer 12 is placed between the fixed terminal 12b and center tap 12c. Thus, the circuit of FIG. 3 provides bass boost/cut characteristics as shown in FIG. 7 without changing a particular frequency ($\frac{1}{2\pi}Rb \cdot Cb$) determined by the lowpass filter.

Figure 8:
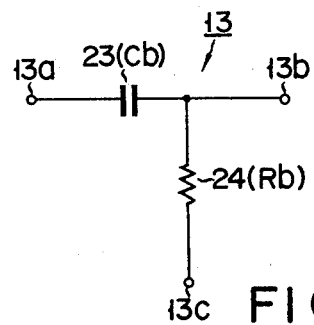
FIG. 8 is a circuit diagram of a highpass filter circuit which may be used as the filter circuit in the circuit of FIG. 3.

FIG. 8 shows a highpass filter, as an example of the filter circuit 13 of FIG. 3, comprising a capacitor 23 (Cb) and a resistor 24 (Rb). The transfer function T(s) of the highpass filter circuit is $$T(s) = 1 + \frac{a \cdot s \cdot Rb \cdot Cb}{1 + s \cdot Rb \cdot Cb}$$

Figure 9:
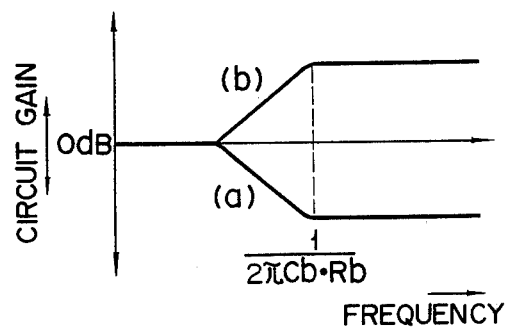
FIG. 9 shows treble boost/cut characteristics of the circuit of FIG. 3 when the filter circuit of FIG. 8 is used.

Curve (a) in FIG. 9 shows the transfer function Tx of the circuit of FIG. 4, and curve (b) in FIG. 9 the transfer function Ty of the circuit of FIG. 5. Thus, the circuit of FIG. 3 using the highpass filter shown in FIG. 8 provides treble boost/cut characteristics as shown in FIG. 9 without changing a specific frequency determined by the highpass filter circuit.

In the circuit of FIG. 3, the frequency characteristic of the filter circuit may be varied, for instance, by varying the resistance of a resistor. In this case, the circuit gain and the frequency range over which the circuit gain is to be varied can be varied independently of each other.

Figure 10:
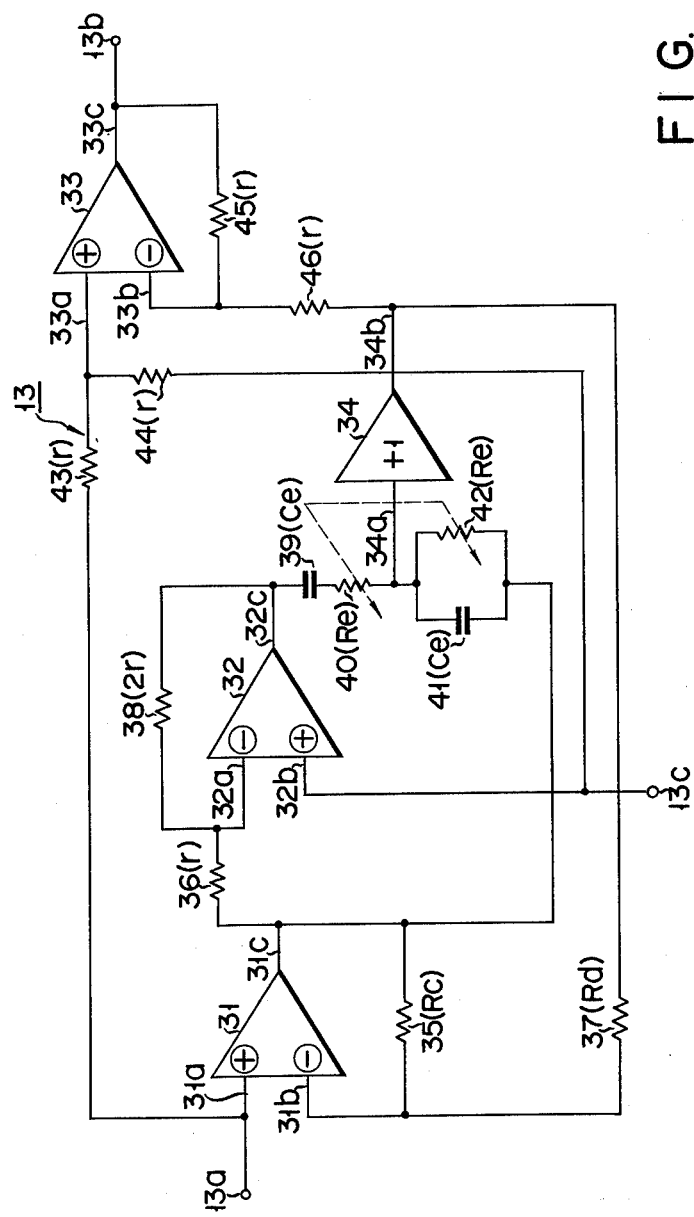
FIG. 10 is a circuit diagram of a bandpass filter circuit which may be used as the filter circuit of FIG. 3.

FIG. 10 shows an example of a bandpass filter, which is particularly suited for tone control over the midfrequency range. In FIG. 10, an operational amplifier 31 has its noninverting input terminal 31a connected to the terminal 13a, its output terminal 31c connected through a resistor 35 (Rc) to its inverting input terminal 31b and also connected through a resistor 36 (r) to an inverting input terminal of an operational amplifier 32. The operation amplifier 32 has its output terminal 32c connected through a resistor 38 (2r) to its inverting input terminal 32a and also connected through a series connection of a capacitor 39 (Ce) and a resistor 40 (Re) to an input terminal 34a of a voltage follower 34 having a gain of unity. The output terminal 31c of operational amplifier 31 is also connected through a parallel connection of a resistor 42 (Re) and a capacitor 41 (Ce) to the input terminal 34a of voltage follower 34. The output terminal 34b of voltage follower 34 is connected through a resistor 37 (Rd) to the inverting input terminal 31b of operational amplifier 31 and also connected through a resistor 46 (r) to an inverting input terminal 33b of an operational amplifier 33. A noninverting input terminal 33a of operational amplifier 33 is connected through a resistor 43 (r) to the input terminal 31a of operational amplifier 31 and also connected through a resistor 44 (r) to the terminal 13c of filter circuit 13 and the noninverting input terminal 32b of operational amplifier 32. The output terminal 33c of operational amplifier 33 is connected to the terminal 13b of filter circuit 13 and through a resistor 45 (r) to its inverting input terminal 33b.

In the above circuit, the resistors 40 and 42 are ganged variable resistors adapted to vary the center frequency of the bandpass filter 13.

Since in this circuit the resistor 38 has double the resistance value of the resistor 36, the operational amplifier 32 has a gain of −2. Thus, the transfer function G1 of the circuit between the output terminal 31c of operational amplifier 31 and the input terminal 34a of voltage follower 34 is given by $$G1 = \frac{s^2 + \left(\frac{1}{Ce \cdot Re}\right)^2}{s^2 + 3s\left(\frac{1}{Ce \cdot Re}\right) + \left(\frac{1}{Ce \cdot Re}\right)^2}$$

Consequently, the overall transfer function T(s) of the circuit of FIG. 10 is $$T(s) = 1 - \frac{1}{m \cdot \frac{s^2 + \left(\frac{1}{Re \cdot Ce}\right)^2}{s^2 + 3s\left(\frac{1}{Re \cdot Ce}\right) + \left(\frac{1}{Re \cdot Ce}\right)^2}} \quad (22)$$

where $m = \frac{Rd}{Rc + Rd}$

Figure 11:
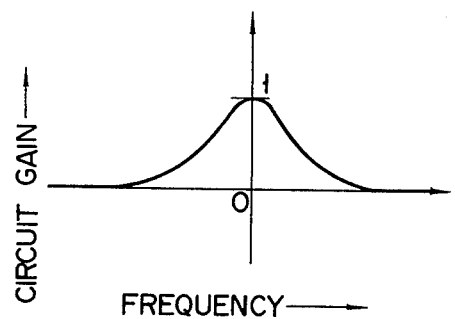
FIG. 11 shows the frequency response of the bandpass filter of FIG. 10.

The circuit having such a transfer function provides a bandpass frequency characteristic as shown in FIG. 11.

Substituting equation (22) into equations (9) and (18) yields $$Tx(s) = \frac{1}{1 + a \cdot T(s)} \quad (23)$$

-continued
$$Ty(s) = 1 + \alpha \cdot T(s) \quad (24)$$

where $0 \leq |T(s)| \leq 1$ and $0 \leq \alpha \leq Ra/Rs$

Figure 12:
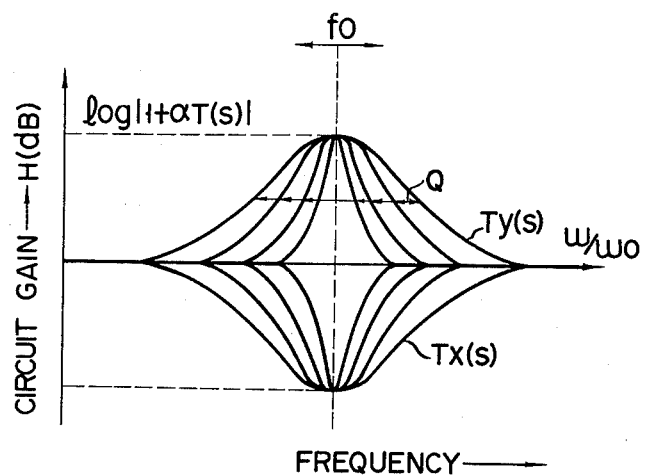
FIG. 12 shows the frequency characteristics of the circuit of FIG. 3 when the filter circuit of FIG. 10 is used.

The transfer functions Tx(s) and Ty(s) represent such frequency responses as shown in FIG. 12.

When the filter circuit of FIG. 10 is used in the circuit of FIG. 3:

(1) in order to vary the circuit gain, $k(=1+Rx/Ry)$ may be varied since $\alpha = Ra/(Rx+k \cdot Rs)$, that is, the potentiometer may be adjusted;

(2) in order to vary the center frequency $f_0$, either one of the parameters Re and Ce, for instance, Re in T(s) may be varied; and (3) the quality factor or sharpness Q of frequency response may be varied by varying the factor $m = Rd/(Rc+Rd)$ in T(s), that is, either one of the resistance values of the resistors 35 and 37.

Figure 13:
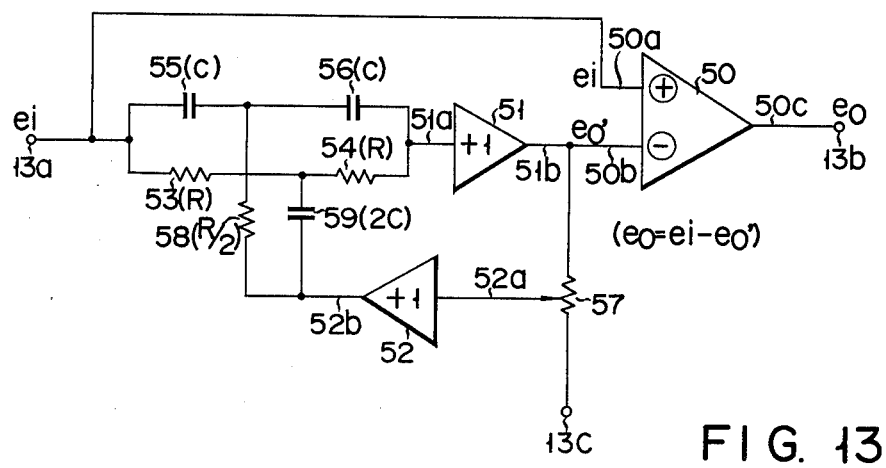
FIG. 13 is a circuit diagram of another bandpass filter circuit which may be used as the filter circuit of FIG. 3.

FIG. 13 shows another example of the filter circuit, which is suited for tone control over the mid-frequency range and comprised of an operational amplifier 50 and and voltage followers 51 and 52.

The operational amplifier 50 has its noninverting input terminal 50a connected to the terminal 13a and its output terminal 50c to the terminal 13b. The voltage follower 51 has its input terminal 51a connected through a serial combination of resistors 53 and 54 of equal resistance value (R) and a serial combination of capacitors 55 and 56 of equal capacitance value (C) to the terminal 13a and its output terminal 51b connected to an inverting input terminal 50b of operational amplifier 50 and also connected through a potentiometer 57 to the terminal 13c. The voltage follower 52 has its input terminal 52a connected to a slider of the potentiometer 57 and its output terminal 52b connected through a resistor 58 (R/2) to the connection point between the capacitors 55 and 56 and also connected through a capacitor 59 (2C) to the connection point between the resistors 53 and 54.

The transfer function T'(s) of the circuit between the terminal 13a of the filter circuit of FIG. 13 and the inverting input terminal 50b of operational amplifier 50 is given by $$T'(s) = \frac{s^2 + \left(\frac{1}{R \cdot C}\right)^2}{s^2 + 4s\left(\frac{1}{R \cdot C}\right) + \left(\frac{1}{R \cdot C}\right)^2}$$

Figure 14:
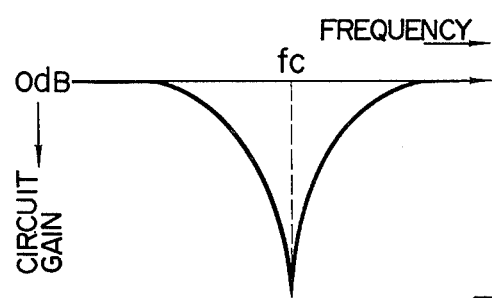
FIG. 14 shows the frequency characteristic of the signal transmission path led from an input terminal to the inverting input of operational amplifier in the circuit of FIG. 13.

The transfer function T'(s) provides a band rejection frequency response as shown in FIG. 14.

Figure 15:
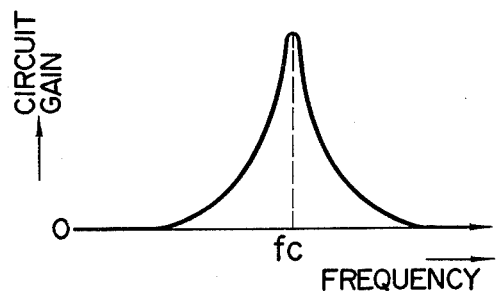
FIG. 15 shows the frequency characteristic of the filter circuit of FIG. 13.

Thus, when the operational amplifier 50 has a gain of unity, the transfer function T(s) of the overall circuit shown in FIG. 13 is $$T(s) = \frac{s^2 + \left(\frac{1}{R \cdot C}\right)^2}{s^2 + 4(1-n) \cdot s \frac{1}{R \cdot C} + \left(\frac{1}{R \cdot C}\right)^2} \quad (25)$$

where $n = Rb/(Ra+Rb)$, Ra is the resistance value between the slider of potentiometer 57 and the inverting input terminal 50b of operational amplifier 50, and Rb is the resistance value between the slider of potentiometer 57 and the terminal 13c. The filter circuit of FIG. 13 has a bandpass frequency response as shown in FIG. 15.

The transfer functions Tx(s) and Ty(s) of the circuit of FIG. 3 using the filter circuit of FIG. 13 are $$Tx(s) = \frac{1}{1 + \alpha \cdot T(s)}$$

$$Ty(s) = 1 + \alpha \cdot T(s)$$

Figure 16:
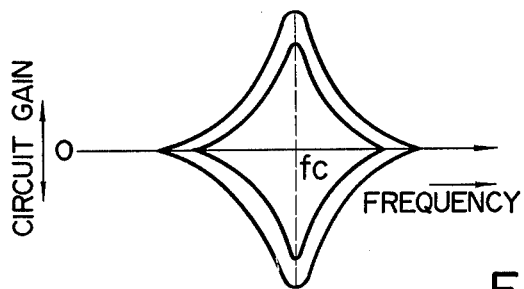
FIG. 16 shows the band boost/cut characteristics of the circuit of FIG. 3 when the filter circuit of FIG. 13 is used.

FIG. 16 shows the frequency response characteristics of the circuit of FIG. 3 having these transfer functions.

When the filter circuit of FIG. 13 is used in the circuit of FIG. 3;

(1) to vary the circuit gain, the potentiometer 12 may be adjusted;

(2) to vary the center frequency, either one of the parameters R and C in T(s), for instance R, may be varied; and (3) the sharpness Q of the circuit may be varied by varying the factor $n = Rb/(Ra+Rb)$ of T(s), that is, by varying the potentiometer 57.

In the circuit of FIG. 3, the terminals (a) and (b) are virtual ground points, that is, at the terminals (a) and (b) the impedance is substantially zero ohms. At the terminal (c), which is the output terminal of operational amplifier 11, the impedance is substantially zero ohms. Thus, even if a plurality of circuits each contained within a broken line outline in FIG. 3 are connected in parallel at the terminals (a), (b) and (c), their characteristics are not affected by one another. For example, when a circuit using the lowpass filter circuit shown in FIG. 6, a circuit using a highpass filter circuit shown in FIG. 8 and a circuit using a bandpass filter circuit shown in FIG. 10 or 13 are connected in parallel with one another at the terminals (a), (b) and (c), it is possible to provide triple tone controls respectively over the low frequency range, mid-frequency range and high frequency range.

While in the circuit of FIG. 3 the first and second operational amplifiers 10 and 11 are connected such that they operate as a noninverting amplifier and inverting amplifier respectively, it is also possible to connect the first and second operational amplifiers 10 and 11 as inverting and noninverting amplifiers respectively.

What is claimed is:
1. A frequency response characteristic adjustable circuit comprising:
a first operational amplifier having its first input terminal connected through a first resistor to an input terminal for receiving an input signal, its second input terminal connected to circuit ground and its output terminal connected to an output terminal for taking out an output signal;
a second operational amplifier having its first input terminal connected to circuit ground, its second input terminal connected through a second resistor to said output terminal of said first operational amplifier and its output terminal connected through a third resistor to said second input terminal of said second operational amplifier and also connected through a fourth resistor to said first input terminal of said first operational amplifier;
a potentiometer having a first fixed terminal connected to said first input terminal of said first operational amplifier, a second fixed terminal connected to said second input terminal of said second opera- tional amplifier, a center tap connected to circuit ground and a slider terminal; and a filter circuit having a first terminal connected to said output terminal of said second operational amplifier, a second terminal connected to said slider terminal of said potentiometer and a third terminal connected to circuit ground.

2. The circuit according to claim 1, wherein said first and second input terminals of each of said first and second operational amplifiers are noninverting and inverting input terminals, respectively.

3. The circuit according to claim 1, wherein said first to fourth resistors have substantially the same resistance value.

4. The circuit according to claim 1, wherein said filter circuit is a lowpass filter.

5. The circuit according to claim 1 or 4, wherein said filter circuit includes a resistor connected between said first and second terminals and a capacitor connected between said second and third terminals.

6. The circuit according to claim 1, wherein said filter circuit is a highpass filter.

7. The circuit according to claim 1 or 6, wherein said filter circuit includes a capacitor connected between said first and second terminals and a resistor connected between said second and third terminals.

8. The circuit according to claim 1, wherein said filter circuit is a bandpass filter.

9. The circuit according to claim 1 or 8, wherein said filter circuit includes:

a third operational amplifier having a noninverting input terminal connected to said first terminal, an inverting input terminal, and an output terminal connected through a fifth resistor to said inverting input terminal of said third operational amplifier;

a fourth operational amplifier having an inverting input terminal connected through a sixth resistor to said output terminal of said third operational amplifier, a noninverting input terminal connected to said third terminal and an output terminal connected through a seventh resistor to said inverting input terminal of said fourth operational amplifier;

a serial combination of an eighth resistor and a first capacitor and a parallel combination of a ninth resistor and a second capacitor, said serial combination and parallel combination being serially connected between said output terminal of said fourth operational amplifier and said output terminal of said third operational amplifier;

a voltage follower having an input terminal connected to the connection point between said serial combination and parallel combination and an output terminal connected through a tenth resistor to said inverting input terminal of said third operational amplifier; and a fifth operational amplifier having a noninverting input terminal connected through an eleventh resistor to said first terminal and also connected through a twelfth resistor to said third terminal, an inverting input terminal connected through a thirteenth resistor to said output terminal of said voltage follower and an output terminal connected through a fourteenth resistor to said inverting input terminal of said fifth operational amplifier and also connected to said second terminal.

10. The circuit according to claim 9, wherein said seventh resistor has substantially double the resistance value of said sixth resistor, said eighth and ninth resistors have substantially the same resistance value, and said first and second capacitors have substantially the same capacitance value.

11. The circuit according to claim 10, wherein said eighth and ninth resistors are ganged variable resistors.

12. The circuit according to claim 1 or 8, wherein said filter circuit includes:

a third operational amplifier having a noninverting input terminal connected to said first terminal, an inverting input terminal connected through a second potentiometer having a slider terminal of said third terminal and an output terminal connected to said second terminal;

a first voltage follower having an output terminal connected to said inverting input terminal of said third operational amplifier;

a serial combination of fifth and sixth resistors and a serial combination of first and second capacitors, said serial combinations being connected in parallel between said first terminal and said input terminal of said first voltage follower; and a second voltage follower having an input terminal connected to said slider terminal of said second potentiometer and an output terminal connected through a seventh resistor to the connection point between said first and second capacitors and also connected through a third capacitor to the connection point between said fifth and sixth resistors.

13. The circuit according to claim 12, wherein said first and second capacitors have substantially the same capacitance value, said fifth and sixth resistors have substantially the same resistance value, said seventh resistor has substantially one half of the resistance value of said fifth and sixth resistors, and said third capacitor has substantially double the capacitance value of said first and second resistors.

* * * * *